(12) United States Patent
Hofmann et al.

(10) Patent No.: US 8,689,436 B2
(45) Date of Patent: Apr. 8, 2014

(54) TWO ABUTTING SECTIONS OF AN ALIGN FIXTURE TOGETHER FLOATINGLY ENGAGING AN ELECTRONIC COMPONENT

(75) Inventors: Thomas Hofmann, Stephanskirchen (DE); Helmut Scheibenzuber, Feldkirchen-Westerham (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 706 days.

(21) Appl. No.: 12/858,400

(22) Filed: Aug. 17, 2010

(65) Prior Publication Data
US 2011/0041311 A1 Feb. 24, 2011

Related U.S. Application Data

(60) Provisional application No. 61/234,879, filed on Aug. 18, 2009.

(51) Int. Cl.
*B23P 19/00* (2006.01)

(52) U.S. Cl.
USPC ............. 29/759; 29/760; 29/832; 29/834; 439/68; 439/71; 439/319; 439/552; 438/14; 438/15; 438/117; 324/555

(58) Field of Classification Search
USPC ............. 29/759, 760, 225, 559, 832, 834; 439/68, 71, 73, 319, 328, 350, 357, 439/552, 557; 438/14, 15, 117; 324/555
See application file for complete search history.

(56) References Cited

U.S. PATENT DOCUMENTS

| | | | |
|---|---|---|---|
| 4,427,249 A | 1/1984 | Bright et al. |
| 5,215,472 A | 6/1993 | DelPrete et al. |
| 5,596,229 A | 1/1997 | Simon |
| 5,872,458 A | 2/1999 | Boardman et al. |
| 6,268,740 B1 | 7/2001 | Iida |
| 6,404,638 B1 | 6/2002 | Messina |
| 7,129,726 B2 | 10/2006 | Tashiro et al. |
| 7,156,680 B2 | 1/2007 | Saito |
| 7,410,363 B1 | 8/2008 | Gattuso et al. |

(Continued)

FOREIGN PATENT DOCUMENTS

| | | |
|---|---|---|
| CN | 1841693 A | 10/2006 |
| EP | 0 844 655 A2 | 5/1998 |

(Continued)

OTHER PUBLICATIONS

Disclosed Anonymous 32449, Airjaw Centering Device (1 page).

(Continued)

*Primary Examiner* — Peter DungBa Vo
*Assistant Examiner* — Jeffrey T Carley
(74) *Attorney, Agent, or Firm* — Christie, Parker & Hale, LLP (57) ABSTRACT

An align fixture for aligning an electronic component having a receptacle adapted to receive the electronic component and having a first abutting section and a second abutting section, the align fixture further having a first elastic unit and a second elastic unit, the first abutting section is flexibly mounted via the first elastic unit, and the second abutting section is flexibly mounted via the second elastic unit, and the first abutting section and the second abutting section are together adapted to floatingly engage the electronic component.

14 Claims, 4 Drawing Sheets

(56) References Cited

U.S. PATENT DOCUMENTS

| | | | |
|---|---|---|---|
| 2003/0017629 A1* | 1/2003 | Tsui et al. | 438/14 |
| 2006/0154386 A1 | 7/2006 | Cheng et al. | |
| 2006/0220667 A1 | 10/2006 | Tashiro et al. | |
| 2006/0290369 A1 | 12/2006 | Yamashita et al. | |
| 2007/0285106 A1* | 12/2007 | Henry et al. | 324/555 |

FOREIGN PATENT DOCUMENTS

| | | |
|---|---|---|
| EP | 2 290 377 A2 | 3/2011 |
| JP | 48-45146 | 10/1973 |
| JP | 49-82967 | 8/1974 |
| JP | H04-096845 | 8/1992 |
| JP | 06-124981 | 5/1994 |
| JP | 09-040068 | 2/1997 |
| JP | 10-163237 | 6/1998 |
| JP | 10-284878 | 10/1998 |
| JP | 11-195895 | 7/1999 |
| JP | 2000-049210 | 2/2000 |
| JP | 2002-25732 | 1/2002 |
| JP | 2005-26499 | 1/2005 |
| JP | 2006-284384 | 10/2006 |
| JP | 2007-106799 | 4/2007 |
| WO | WO2004/106944 | 12/2004 |
| WO | WO 2009/100910 A1 | 8/2009 |

OTHER PUBLICATIONS

EPO Search Report for EP Application No. 10171341.0 dated Jul. 6, 2011 (3 pages).

English Translation of Japanese Office action dated Mar. 26, 2012 for Japanese Patent Application No. 2010-181844, date of mailing Apr. 3, 2012, 6 pages.

KIPO Notification of Ex Officio Provisional Refusal dated Oct. 28, 2011, for Korean Application No. 10-2010-0080027, 5 pages.

Japanese Office action dated Jul. 28, 2011, for Japanese Patent Application No. 2010-181846, date of mailing Aug. 2, 2011, with English Translation of same, 5 pages.

KIPO Office action dated Jan. 18, 2012 for Korean Application No. 10-2010-0080028, 5 pages.

English Translation of Japanese Office action dated Apr. 16, 2012 for Japanese Patent Application No. 2010-181847, date of mailing Apr. 24, 2012, 4 pages.

* cited by examiner

TWO ABUTTING SECTIONS OF AN ALIGN FIXTURE TOGETHER FLOATINGLY ENGAGING AN ELECTRONIC COMPONENT

CROSS-REFERENCE TO RELATED APPLICATION

This application claims the benefit of U.S. Provisional Patent Application No. 61/234,879, filed on Aug. 18, 2009 in the United States Patent and Trademark Office, the entire content of which is incorporated herein by reference.

FIELD OF THE INVENTION

The invention relates to an align fixture for aligning an electronic component. Moreover, the invention relates to a carrier.

Beyond this, the invention relates to a method of using the carrier.

BACKGROUND OF THE INVENTION

Integrated circuits are usually fabricated on semiconductor wafers. The integrated circuits have a variety of uses and can be found in versatile electric devices. Depending on the purposes they are made for the integrated circuits and other electronic components such as resistors, capacitances and inductances are packaged, marked and tested before being assembled. For example, MEMS (micro electro mechanical system) components are tested under given temperatures, pressure, angles of inclination and different types of accelerations. Hence, the complete manufacturing of electronic components can be divided into processes of pure fabrication and a process after finishing the contact patterns of the electronic components. There are two types of machine which handle electronic components the so called "Gravity handler" handling singulated electronic components and the "Strip handler" which handle so called strips.

US 2003/0017629 A1 discloses an apparatus for supporting singulated electronic devices during a testing operation, comprising: a main body and a support member, wherein said support member is made of non-conducting high-resistivity material and comprises a plurality of recesses, each said recess being adapted to receive an individual singulated device. There is also disclosed a method for testing such devices in which the devices are carried on support members through a testing process including one or more environmental control chambers.

US 2006/0154386 A1 discloses an apparatus and method are provided for aligning a plurality of semiconductor devices placed on a carrier. Alignment guides are located adjacent to each device in use, and arranged such that they correspond to a desired alignment of each semiconductor device. For alignment, the semiconductor devices are held by a positioning device comprising a plurality of holders, each holder being configured to generate a force to hold a semiconductor device. Actuators are also provided that are operative to move the positioning device and holders to bias the semiconductor devices against the alignment guides to orientate the semiconductor devices until they are aligned with said alignment guides.

U.S. Pat. No. 7,156,680 B2 discloses an insert and electronic component handling apparatus provided with the same. To provide a guide core capable of being detachably attached to an insert body and an insert body to which the guide core can be detachably attached, U.S. Pat. No. 7,156,680 B2 provides a guide core able to be attached in a detachable way to an insert body, comprising a supporting portion capable of supporting an external terminal face of an area array type electronic component so that external terminals of the area array type electronic component are exposed to the direction of connection terminals of a socket, and a hook receiver able to be engaged in a releasable way with a hook portion provided to the insert body, and an insert body able to be attached in a detachable way with the guide core, comprising an electronic component guide portion comprising a guide core attachment socket to which the guide core is attached, and an electronic component inlet connected with the guide core attachment socket so that an electronic component can be guided to the guide core attached to the guide core attachment socket, and a hook portion able to be engaged in a releasable way with a hook receiver provided to the guide core.

U.S. Pat. No. 5,596,229 A discloses a chip carrier structure for containing a chip carrier having electrical contact pads having a positioning structure for the chip carrier and a slotted structure mated to form a mated structure containing said chip carrier, the slots of the slotted structure being in alignment with the pads of the chip carrier to provide electrical and mechanical access to the pads from the exterior to the interior of the mated positioning and slotted structures.

OBJECT AND SUMMARY OF THE INVENTION

There may be a need for a system capable of aligning an electronic component in an efficient way.

In order to achieve the object defined above, an align fixture for aligning an electronic component, a carrier comprising multiple align fixtures, and a method of using a carrier are provided.

According to an exemplary embodiment of the invention, an align fixture for aligning an electronic component is provided, wherein the align fixture comprises a receptacle (which may be denoted as a device to receive and contain something) adapted (particularly intended) to receive the electronic component and having a first abutting (particularly touching) section (particularly segment) and a second abutting section. The align fixture further comprises a first elastic (particularly flexible, resilient or springy) unit (particularly a piece or complex of apparatus serving to perform one particular function) and a second elastic unit, wherein the first abutting section is flexibly mounted via the first elastic unit, and the second abutting section is flexibly mounted via the second elastic unit. The first abutting section and the second abutting section may together be adapted to floatingly (particularly connected or constructed so as to operate and adjust smoothly) engage (particularly come into contact with) the electronic component.

According to another exemplary embodiment of the invention, a carrier for aligning multiple electronic components is provided, wherein the carrier comprises multiple align fixtures having the above mentioned features.

According to still another exemplary embodiment of the invention, a method of using a carrier having the above mentioned features is provided, wherein the method comprises:

actuating a clamping mechanism to expose openings in the receptacles being larger than the electronic components (particularly moulded parts) to be received;

positioning (particularly placing) the electronic components in the openings in the receptacles (particularly after exposing the openings);

actuating the clamping mechanism to reduce a size of the opening so that the electronic components are aligned within the receptacles of the carrier (particularly after positioning).

The term "align fixture" may particularly denote a device for supporting a physical structure during machining or handling. A "physical structure" may in this context particularly denote the material, piece of material or electronic component that is operated upon at any stage in the process of manufacture or handling.

The term "align" may particularly denote that something is ranged or lined up. E.g. an electronic component may be aligned with a fixed abutting section.

The term "electronic component" may particularly denote any component adapted for being mounted on an electronic support substrate such as a printed circuit board. Such electronic components may also be handled by a handling machine, the so called "handler". Examples for electronic components are electronic chips, i.e. packaged dies or naked unpackaged dies.

The term "receptacle" may particularly denote a device to receive and contain something or may more particularly denote a container for an electronic component.

The term "abutting section" may particularly denote a touching segment, i.e. a portion of a receptacle which directly abuts to an electronic component.

The term "float" may particularly denote a way of mounting an electronic device allowing for a certain drift without a defined external control. In particular "floatingly engage" may denote that the electronic component may come into contact with the first abutting section and with the second abutting section and may be held by the first abutting section and the second abutting section. The electronic component may change its position relative to a base support section without any friction forces or with negligible friction forces. In other words, a floatingly mounted electronic device may denote a mounting state of the electronic device in which it may be held between two abutting portions, however allowing for a slight self-adaptation of a position of the electronic device.

The term "carrier" may particularly denote a container for carrying or a device that carries. A carrier may be a strip-like member adapted for carrying multiple electronic components in receptacles of the carrier. Such a carrier may be used in conjunction with a handler allowing to handle the electronic devices using the carrier for subsequently carrying out a test (such as a function test) of the electronic components.

The term "clamp" may particularly denote that the carrier is designed to have parts brought together for holding or compressing the electronic components. The parts which may be brought together may be the first abutting sections and the second abutting sections. The clamping may be elastically. The term "elastic" may particularly denote that a force may be exerted which is particularly flexible, resilient or springy such as a Hook force.

According to an exemplary embodiment of the invention, an align fixture may be provided which engages an electronic component in a self-acting manner by two abutting sections both being flexibly mounted so as to enable floating of the electronic component. The first abutting section may be flexibly mounted via a first elastic unit and the second abutting section may be flexibly mounted via a second elastic unit. In an unstressed position without a received electronic component the size of the receptacle may be smaller than the electronic component to be received. The first abutting section and/or the second abutting section are adapted to be stretched to provide an opening matching with a receiving size of the receptacle. The electronic component may be received in the receiving size of the receptacle. The first abutting section and the second abutting section may perform a transition from the receiving size of the receptacle to a clamping size of the receptacle wherein in the clamping size of the receptacle the first abutting section and the second abutting section are adapted to engage the electronic component however still allowing for some degree of freedom of a position of the electronic component in the receptacle. The transition from the receiving size of the receptacle to the clamping size of the receptacle may take place in a self-acting manner. The first abutting section and the second abutting section engage the electronic component floatingly. The electronic component may slide towards the first abutting section by relieve the tension of the second elastic unit and may slide towards the second abutting section by relieve the tension of the second elastic unit. Friction forces may be small relative to the sliding forces. Such a system may allow to obtain both stability and flexibility.

In an embodiment, a carrier may be provided for aligning multiple components, wherein the carrier comprises multiple align fixtures. The multiple align fixtures may be arranged in a matrix form (i.e. in rows and columns) and may be fixedly mounted together to form the carrier. The carrier may have similar properties like the single align fixture but may be applicable on multiple electronic components, i.e. may carry multiple electronic components at the same time, particularly in an integrally formed way. The electronic components may be aligned in defined manner in the receptacles by the align fixtures of the carrier. Thus, the carrier is adapted to allow for aligning multiple electronic components.

According to an exemplary embodiment of the invention, a method of using the carrier may be provided, wherein the electronic components may be placed in temporarily enlarged receptacles of the carrier and thereupon may be elastically clamped and aligned by a clamping mechanism in a reduced size of the receptacles.

The transition of the enlarged size of the receptacles to a clamping size of the receptacles may take place in a self-acting manner.

In the following, further exemplary embodiments of the align fixture will be described. However, these embodiments also apply to the carrier and to the method.

The align fixture may comprise an actuatable structure formed at the first abutting section, wherein the actuatable structure may be actuable by a corresponding actuation structure (of a handler device or the like) for manipulating the receptacle. The actuatable structure may be for instance a recess, a protrusion, etc. which can be actuated by any appropriate force application mechanism (for instance applying a mechanical force, an electric force, a magnetic force, etc.) controlled by the actuation structure. The actuation structure may be configured (for instance shaped and/or dimensioned) correspondingly to the actuatable structure and may be for instance a protrusion or any other force application element which can actuate the actuatable structure using any appropriate force application mechanism (for instance applying a mechanical force, an electric force, a magnetic force, etc.) for controlling the receptacle in a desired way (for instance for temporarily enlarging or reducing an opening thereof).

An actuatable structure (particularly an actuatable hole, an actuatable pin or an actuatable arm) may be adapted to be actuated to, in turn, actuate the elastic unit. The actuatable structure may be located besides the receptacle (particularly beside a boundary area of the receptacle). The actuatable structure and the first abutting section may form a stiff member. The actuatable structure may be accessible (by an actuation element controlled by a controller of a handler) from a side from which the electronic component is to be received.

In an embodiment, exclusively the first abutting section and the second abutting section are together adapted to floatingly and laterally engage the electronic component. In other words, the electronic component may be held at lateral side sections by the two slidably mounted abutting sections alone. No rigid fixations limit the freedom of a planar drift of the electronic component received in the receptacle in a plane in which the elastic units are compressible/expandable, i.e. in a plane parallel to a main plane of the electronic device. Particularly, in an embodiment, the electronic component may be held without abutting laterally to spatially fixed rigid abutting sections. All (two or more) abutting sections may be assembled flexibly. Spring elements may be arranged diagonally on two opposed corner regions of a receptacle. Spring elements also may be arranged along parallel side sections of a receptacle. There are no rigid abutting sections in a main plane of forces exerted by the spring elements. This may be avoid cracking of the electronic component being held in the receptacle since the all forces engaging on the electronic component may engage in a flexible manner. Spring stiffness of the opposed spring elements may be equal to align the electronic component in the middle. Spring stiffness of the spring element and the opposed spring element may be different so that the electronic component is aligned to the spring element with the smaller spring stiffness value.

The align fixture may comprise an actuatable structure formed at the first abutting portion and/or at the second abutting portion, wherein the actuatable structure may be actuatable by a corresponding actuation structure (of a handler device or the like) for manipulating the receptacle. The actuatable structure may be for instance a recess, a protrusion, etc. which can be actuated by any appropriate force application mechanism (for instance applying a mechanical force, an electric force, a magnetic force, etc.) controlled by the actuation structure. The actuation structure may be configured (for instance shaped and/or dimensioned) correspondingly to the actuatable structure and may be for instance a protrusion, a pin or any other force application element which can actuate the actuatable structure using any appropriate force application mechanism (for instance applying a mechanical force, an electric force, a magnetic force, etc.) for controlling the receptacle in a desired way (for instance for temporarily enlarging or reducing an opening thereof).

An actuatable element (particularly an actuatable hole, an actuatable pin or an actuatable arm) may be adapted to be actuated to, in turn, actuate the elastic units. The actuatable element may be located beside the receptacle (particularly beside a boundary area of the receptacle). An actuatable element and the first abutting section may form a stiff member. An actuatable element and the second abutting section may form a further stiff member. The actuatable element may be accessible (by an actuation element controlled by a controller of a handler) from a side from which the electronic component is to be received. An actuatable hole may be situated in an L-shaped area of the first abutting section. A pin may be inserted in the actuatable hole perpendicularly to an actuating force direction of the elastic unit.

The above actuatable structure of the align fixture may also be denoted as an adjusting unit which may be adapted to be actuated by the above actuation structure to adjust an orientation of the first abutting section and the second abutting section by a translatory motion and a rotational motion. Such an adjusting unit may be adapted to adjust the linear and angular position of two angled abutting (particularly touching) elements (particularly stiff and straight sections or points) of the first abutting section and the second abutting section. An abutting section may comprise one stiff and straight abutting element and an abutting section may comprise two angled stiff and straight abutting elements. The linear and angular position of at least two angled abutting elements may define the linear and angular position of the electronic component. For instance, the linear and angular position of a rectangle or in this case of an electronic component may be defined by the position and orientation of two angled sides of the rectangle or the electronic component. Two angled sides of the electronic component may abut with at least two angled abutting elements. The adjusting unit may comprise at least two adjusting structures (particularly a hole, a pin or an arm) fixedly mounted to at least two angled abutting elements. The adjusting unit which may be formed by two of these adjusting structures mounted at two angled abutting sections may define the linear and angular position of the electronic component which is engaged between the first abutting section and the second abutting section.

The adjusting unit may be adapted to be actuated for enlarging the size of the receptacle. Since the linear and angular position of the receptacle and the electronic component received in the receptacle may be defined by at least two angled abutting elements interacting with the adjusting unit, the adjusting unit may be adapted to be removed from the angled side sections of the electronic component in the main plain of the electronic component. The adjusting unit may be identical with the actuatable structure. Thus, the adjusting unit allows for enlarging the size of the receptacle. The actuatable structure and the adjusting unit may be located beside the receptacle (particularly beside a boundary area of the receptacle). The adjusting unit and the actuatable structure may be accessible from a side from which the electronic component is received while the electronic component is located or is being placed in the receptacle. The structure of the adjusting unit may be adapted to rotate and to relocate the electronic component and the adjusting unit may be adapted to enlarge the size of the receptacle.

The first abutting section may be adapted to exert a first force and the second abutting section may be adapted to exert a second force on the electronic component, wherein the first force and the second force may be at least partially opposed (particularly are exerted against one another, i.e. antiparallel) to one another. The electronic component may be aligned in the receptacle of the align fixture. The first abutting section and the second abutting section abut on side sections of the electronic component. According to the exerted forces, the electronic component may rest and be aligned if the forces exerted on the electronic component are at least not directed in one direction. The electronic component may rest, by including frictional forces, when the two forces exerted on the electronic component by the first abutting section and the second abutting section are at least partially opposed.

The first abutting section and the second abutting section may be adapted so that the first force is exerted in a main plane of the receptacle (i.e. a force vector may lie within the main plane) and the second force is exerted parallel to this main plane of the receptacle. The main plane of the receptacle may be defined by being parallel to a main plain of the align fixture. The electronic component may be aligned in an appropriate way if the forces exerted by the first abutting section and the second abutting section are exerted in one plane. The first abutting section and the second abutting section may abut on side sections of the electronic component. By exerting both the first force and the second force in a main plane of the receptacle, the total force on the electronic component shows no turning moment having the tendency to flip the electronic component out of the receptacle. The electronic component may be firmly aligned in the receptacle by forces being parallel to the main plane of the receptacle.

The receptacle may further comprise a base support section which forms a support surface (particularly something to hold up in position by serving as a foundation) parallel to a main plane of the receptacle. The support force exerted by the base support section may act on a main plane of the electronic component, particularly may be antiparallel to the gravitational force. The electronic component may be arranged in the receptacle so that the main plane of the receptacle and the main plane of the electronic component are parallel. The base support section acting on the electronic component may be parallel to a main plane of the receptacle so that the electronic component is aligned by the support of the base support section in the main plane of the receptacle. An advantage of supporting the electronic component in the main plane of the electronic component may be that the load on the electronic component may be dispersed on different parts of the main surfaces of the electronic component and that the first force and the second force of the first and the second abutting sections may be exerted parallel to the base support section. Thus, the orientation of the first force and the orientation of the second force may avoid cracking of the electronic component on the base support section.

The base support section may be adapted to exert a support force perpendicularly to the first force and to the second force. The support force exerted by the base support section may be adapted to align the electronic component rectangular to its main plane. The technical advantage of the support force being perpendicular to the forces exerted by the first and second abutting sections may be so that there is no turning moment being exerted on the electronic component which could tilt the electronic component out of the main plane of the align fixture. Hence, the electronic component may remain in an aligned position relative to its main plane. However, due to the elastic mounting of both the first and second abutting sections, a turning moment may act on the electronic component within the main plane plane, allowing for a rotational floating as well. Hence, the electronic component may be subject to both a translational floating and a rotational floating.

The flexibly mounted first abutting section and the flexibly mounted second abutting section may be adapted to perform a movement parallel to a main plane of the receptacle. The force exerted by the abutting sections which are flexibly mounted is exerted parallel to a main plane of the receptacle. The force to align the electronic component may be provided by the elastic units which may move the flexibly mounted abutting sections and the electronic component in a main plane of the receptacle by the self-acting movement of the elastic unit in a main plane of the receptacle itself. Thus, the forces of the elastic unit may be exerted on the electronic component in a plane in which the electronic component is predominantly rugged or stable.

In particular, the align fixture may comprise a base support plate arranged below the first elastic unit and below the second elastic unit, wherein the first elastic unit and the second elastic unit are adapted to perform a movement parallel to a main plane of the receptacle at least partially supported by the base support plate.

The align fixture may comprise a base support plate above which the elastic units are arranged, wherein the elastic units may be adapted to perform a movement parallel to a main plane of the receptacle at least partially supported by the base support plate. In one embodiment the base support plate and the elastic units may be arranged parallel to a main plane of the receptacle and parallel to a main plane of the complete align fixture. The elastic units may move along the base support plate on which the elastic units may be arranged. At least in one direction (which may be the direction oriented towards the base support plate) the elastic units may be secured against unwanted deformation. The base support plate may be planar or may have one or more recesses adapted to guide the movement of the elastic units.

The align fixture may comprise a base support plate and a receiving plate between which the elastic units may be arranged. The elastic units may be adapted to perform a movement parallel to a main plane of the receptacle at least partially guided (particularly directing the motion of something) by the base support plate and the receiving plate. The receiving plate may particularly have a recess (or a receiving opening) via which the electronic component is receivable in the receptacle by insertion through the recess. In one embodiment the base support plate, the receiving plate and the elastic units may be arranged parallel to a main plane of the receptacle and parallel to a main plane of the complete align fixture. The elastic units may move between the base support plate and the receiving plate between which the elastic units may be arranged. The elastic units may each be secured against deformation in two directions. The two directions against which the elastic units may be secured may be the direction oriented towards the base support plate and the direction oriented towards the receiving plate. The base support plate and the receiving plate may be planar or may have recesses adapted to guide the movement of the elastic units.

In particular, the align fixture may comprise a base support plate and a receiving plate between which the first elastic unit and the second elastic unit are arranged and wherein the first elastic unit and the second elastic unit are adapted to perform a movement parallel to a main plane of the receptacle at least partially guided by the base support plate and the receiving plate.

The align fixture may further comprise at least one distance adjusting plate adapted for adjusting thicknesses. For distance adaption purposes the align fixture may comprise even more than three plates.

The elastic units may each comprise a spring element (particularly a rubber member, any kind of elastic material member, a spring formed from a steel spring plate, a spring formed from a spring wire or any kind of springs such as flat springs, coil springs, leaf springs, etc.). The spring element may be integrally formed from a plate. The spring element(s) of the first elastic unit and the spring element(s) of the second elastic unit may be integrally formed from a common plate. The spring element may show elastic restore forces against deformation, i.e. a Hook behaviour.

Any one of the elastic units may comprise a first spring element and a second spring element, wherein the corresponding abutting section being flexibly mounted is connected with the first spring element and with the second spring element.

In one embodiment the first spring element and the second spring element are angularly arranged relative to one another. Depending on the form, material and size of the spring element it may be advantageous to combine two spring elements to an elastic unit. Even more than two spring elements may form an elastic unit. By combining two or more spring elements to an elastic unit the direction and absolute value of the force exerted by the elastic unit may be adapted. In one embodiment the first spring element and the second spring element are angularly arranged relative to one another.

At least one elastic unit may be a separate elastic member adapted to be mounted at at least one an elastic unit receiving section. The at least one elastic unit receiving section may be formed from one of the plates and may be adapted to receive a separate elastic member. To enhance the adaptivity of the align fixture at least one elastic unit may be a separate elastic member. One elastic unit plate or any other adapted plate may be suitable to receive different types of elastic members. As a consequence of this there may be fewer plates needed to adapt the align fixture to different sizes of electronic components. It may be possible just to change the respective size of the receptacle, the position of the elastic unit receiving section or to change the size of the elastic members to be inserted for adapting the align fixture to different electronic component types. The separate elastic member may be detachably mounted making it more convenient to change the align fixture.

The elastic unit receiving section may be adapted to fix the at least one of the first and the second elastic unit being a separate elastic member at a suspension (particularly fastening or fixing) of the at least one elastic unit so that the at least one elastic unit is fixed against rotation. Otherwise the elastic member may fail in exerting a force in a defined direction. The direction and the value of the force does not vary if the elastic unit is not rotatable. Because of the miniaturization in semiconductor fabrication leading to smaller sizes of semiconductor devices there may be a need for aligning the semiconductor devices very accurately. Thus, it is advantageous to prevent the elastic member received in its suspension against rotation because the forces may be defined in direction and value.

The at least one elastic unit being a separate elastic member may be fixedly installed in a form locking manner. The at least one elastic unit receiving section may be adapted to fix the elastic unit in the suspension of the elastic unit wherein the elastic unit is fixedly installed with positive locking. Slipping of the separate elastic member may be prevented by fixedly installing the elastic unit in a form locking manner. The elastic unit may be prevented from falling out of the align fixture. By installing the elastic unit in a form locking manner the direction and the value of the force exerted by the elastic unit may be defined and may be maintained stable.

The first abutting section, the second abutting section, and the base support section may delimit an electronic component receiving volume in which the electronic component may be received. At least a part of the elastic units may extend below a bottom side of the electronic component receiving volume. By arranging the elastic units below an electronic component receiving volume the space needed for the align fixture may be kept small. For electronic components being larger than the average electronic components it may be helpful to save space in the main plane of the align fixture. Since the deflection of the elastic units may be larger for big sized electronic components it follows that significant (for instance up to eight times of the) space may be saved by arranging the elastic units (or a part of at least one thereof) below the electronic component receiving volume compared to an arrangement in which the elastic units are arranged exclusively beside the electronic component receiving volume.

In particular, at least one of the first elastic unit and the second elastic unit comprises a spring element.

In particular, at least one of the first elastic unit and the second elastic unit comprises a first spring element and a second spring element, wherein the corresponding one of the flexibly mounted first abutting section and the flexibly mounted second abutting section is connected with the first spring element and with the second spring element.

In particular, at least one of the first elastic unit and the second elastic unit is a separate elastic member adapted to be mounted at at least one elastic unit receiving section of the align fixture.

In particular, the at least one elastic unit receiving section is adapted to fix the at least one of the first elastic unit and the second elastic unit being a separate elastic member at a suspension of the corresponding elastic unit so that this elastic unit is fixed to prevent rotation.

In particular, the at least one of the first elastic unit and the second elastic unit is fixedly mounted at the at least one elastic unit receiving section in a form locking manner.

In particular, the first abutting section, the second abutting section, and the base support section delimit an electronic component receiving volume in which the electronic component is to be received; wherein at least a part of at least one of the first elastic unit and the second elastic unit extends below a bottom side of the electronic component receiving volume.

At least one of the flexibly mounted first abutting section and the flexibly mounted second abutting section extends upwardly from the respective one of the first elastic unit and the second elastic unit to which it is mounted, and this abutting section extends aside of the electronic component receiving volume.

One of the abutting sections being flexibly mounted may extend in an upwards direction from the elastic unit to which it is mounted, and this abutting section may extend aside of the electronic component receiving volume. The respective abutting section may extend aside of the electronic receiving volume and in the same height of the electronic receiving volume in order to be adapted to abut on the electronic component to be received. Such a flexibly mounted abutting section may extend from the assigned elastic unit extending below the electronic receiving section upwardly to and aside of (i.e. outside of) the electronic receiving section and the flexibly mounted abutting section may be adapted to abut on an electronic component received in the receptacle. The first abutting section and the second abutting section may be adapted to clamp the electronic component in a space between them.

In particular, the align fixture may comprise an actuatable structure which is adapted to be actuated to adjust an orientation of the first abutting section and the second abutting section by a translatory motion and a rotational motion.

In particular, the actuatable structure is adapted to be actuated for enlarging the size of the receptacle.

At least one of the group consisting of the first abutting section, the second abutting section, the elastic units, the base support section, and the actuatable structure (adjusting unit) may be at least partially integrally formed from a plate. It may be convenient to manufacture at least one functional element from a plate by using design techniques such as etching techniques or laser techniques. These techniques may be optimally suitable for applying them on thin plates, for instance metal plates. By etching or laser cutting, a high accuracy for the structures being manufactured may be achieved.

At least two of the group consisting of the first abutting section, the second abutting section, the elastic units, the base support section, and the actuatable structure (adjusting unit) may be at least partially integrally formed from one plate. The same advantages cited for integrally forming at least one of the functional elements from one plate hold for forming two ore even more functional elements from one plate. It may be even more convenient to manufacture as many functional elements as possible using one plate. Particularly the abutting sections being mounted on the elastic units and the elastic units may be formed from one plate. Thus, the first abutting section, the second abutting section, and the elastic units may be integrally formed from one plate. When properly adapting the shape of the plate it may be even possible to form also the base support section from the same plate.

In the following, further exemplary embodiments of the carrier will be described. However, these embodiments also apply to the align fixture and to the method.

The carrier for aligning multiple electronic components may be provided with multiple align fixtures. In an embodiment, the multiple align fixtures may be integrally formed based on a common substrate (which may be constituted by one or more plates).

A first elastic unit and a second elastic unit may be assigned to each of the receptacles. There may be more elastic units assigned to one receptacle. By assigning elastic units to one receptacle there may be a way to align one electronic component independently from another electronic components. This may be advantageous since receiving and aligning one first electronic component does not have an impact on receiving and aligning another second electronic component.

At least one elastic unit may be assigned to multiple of the receptacles. The elastic unit may comprise more than one elastic sections and may be arranged in that two abutting sections are mounted on opposite sides of one elastic section. Even three, four, five or more receptacles may share one elastic unit. Moreover, is may be cost-efficient and space-saving to provide one elastic unit with more than one elastic section. It may be appropriate to provide an elastic unit plate with as many elastic units and elastic sections, respectively, as there are receptacles or electronic components, respectively.

The carrier may be provided with a first plate comprising the elastic units and a second plate, wherein the first plate may be arranged slidably above the second plate and wherein the first plate may be adapted to allow for a mutual sliding of the multiple align fixtures relative to the second plate. According to an exemplary embodiment of the invention, the carrier may comprise multiple receptacles each receiving an assigned one of the multiple electronic components. The size of the multiple receptacles may be delimited by the first abutting sections of the first plate and the second abutting sections of the second plate. The first abutting sections of the first plate and the second abutting sections of the second plate may lie on opposed sides of the receptacles. The first plate and the second plate may be movable relative to each other along main planes of the first plate and of the second plate and the size of the receptacles may change when the relative position of the first plate and the second plate are changed relative to each other. The first plate and of the second plate may lie parallel to one another. The position of the first plate and of the second plate may be changed diagonally, i.e. a corner region of the first plate and a corner region of the second plate may be approached and contrary to this pulled apart. The movement of the first plate and of the second plate or an approach or pulling apart of the first abutting sections and the second abutting sections may take place in the main planes of the first plate and the second plate. The multiple electronic components may be clamped between the multiple first abutting sections and the multiple second abutting sections in the multiple receptacles when the corner regions of the first plate and the second plate approach. Corner regions of the receptacles may approach and pulled apart simultaneously when the corner regions of the first plate and the second plate approach and are pulled apart.

In particular, the carrier may comprise a first plate comprising the first elastic units and a second plate comprising the second elastic units, wherein the first plate is arranged slidably with respect to the second plate and wherein the first plate is adapted to allow for a mutual relocation of the multiple first abutting sections relative to the multiple second abutting sections.

The first plate may be an elastic unit plate comprising a plurality of first elastic units, wherein each of the receptacles has assigned at least one of the plurality of the first elastic units. Same holds for the second elastic plate and the second elastic units. The first abutting sections may be each formed on a first elastic unit respectively. The second abutting sections may be each formed on a second elastic unit respectively. The purpose of the first elastic units and the second elastic units may be that compensatory tolerances for varying dimensions of the multiple electronic components may be permitted. Otherwise due to the varying dimensions of the electronic components the electronic components may fall out of the receptacles or misalignment may be caused. The first elastic units and the second elastic units may be particularly elastic patterns or rubber parts allowing to adjust elastic properties of the first and second abutting sections. The first elastic unit and the second elastic unit may also be any unit being elastic, such as any kind of springs. In an embodiment the first plate and the second plate may be arranged parallel to each other. The first plate may move along the second plate on which the first plate may be arranged. At least in one direction which may be the direction towards the second plate the first plate may be secured against unwanted deformation. The second plate may be planar or may have recesses adapted to guide the movement of the first plate.

A position or a deformation state of each of the first elastic units and the second elastic units may determine one of the boundaries of the respective assigned receptacles. The position of the first elastic units and the second elastic units may determine the dimensions of the receptacles and the deformation state of the first elastic units and the second elastic units may determine the dimensions of the receptacles. The position of the first elastic units may mutually change with the position of the first plate and the second plate relative to each other. The position of each first abutting section may change relative to each second abutting section. The change of the position of the first plate and the second plate relative to each other may cause a mutual change of the dimensions of each receptacle in the same manner, i.e. the dimensions of the receptacles may increase or the dimensions of the receptacles may decrease mutually. However, each receptacle may change its dimensions individually with a change of the deformation state of the first elastic units and the second elastic units, respectively. Due to the deformation state of the first elastic units and the second elastic units the dimension of the receptacle may increase when the first elastic units and/or the second elastic units are brought into a prestressed position and may decrease when tension is relieved.

The first plate and the second plate may be elastically coupled to each other by at least one plate connecting elastic unit. The at least one plate connecting elastic unit may be under tension when the dimensions of the receptacles are mutually increased and the tension of the plate connecting elastic unit may be relieved or released at least partially when the first plate and the second plate change their positions to decreased dimensions of the receptacles. The dimensions of the receptacles may be mutually decreased when the tension of the at least one plate connecting elastic unit is relieved in a self-acting manner.

The second plate may comprise a first plate abutting section adapted for abutment of the first plate. The first plate may comprise a second plate abutting section adapted for abutment of the second plate. The second plate abutting section and the first plate abutting section may define a clamping size of the receptacles when the first plate abutting section and the second plate abutting section abut on each other, wherein the clamping size of the receptacles may be adapted for a clamping of the electronic components in the respective receptacles. A clamping size of the receptacles, wherein each receptacle may be adapted to clamp a respective electronic component, may be provided by a position of the first plate and the second plate relative to each other. The term "clamp" may particularly denote that the carrier may be designed to have parts brought together for holding or compressing the electronic components. The parts which may be brought together are the first abutting section and the second abutting section.

The plate connecting elastic element and the plurality of elastic units may be adapted to provide a total force for a self-acting transition from an enlarged size of the receptacles in which the electronic components may be receivable in the receptacles towards a reduced clamping size of the receptacles in which the electronic components may be clamped. The total force may be defined by a force exerted by the at least one plate connecting elastic unit minus a force exerted by the plurality of the first elastic units and the second elastic units when the electronic components come into clamping positions. The force of the at least one plate connecting elastic unit may be greater than the force exerted by the plurality of the elastic units and the second elastic units. The total force may be positive and may provide a self-acting transition from an enlarged size of the receptacles to a clamping size of the receptacles where the second plate abutting section of the first plate and the first plate abutting section of the second plate may abut on each other.

In particular, the carrier may comprise a first plate, a second plate and a third plate; wherein the first plate comprises the first elastic units; wherein the second plate comprises the second elastic units; wherein the first plate is arranged floatingly between the second plate and the third plate, and the first plate is adapted to allow for a mutual relocation of the multiple first abutting sections relative to the multiple second abutting sections.

The carrier may further comprise handling structures formed at the first plate and at the second plate. The handling structures may be adapted for handling the first plate and the second plate to relatively move the slidably arranged first plate and second plate against a force of the plate connecting elastic element towards an enlarged size of the receptacles. The handling structures of the carrier may be adapted to relatively move the first plate and the second plate against the total force provided by the force of the at least one plate connecting elastic unit minus the force of the plurality of the first elastic units and the second elastic units. The handling structures may be adapted to enlarge the receptacles against the total force to the enlarged size in which the bodies of the electronic components are receivable in the receptacles.

The carrier may comprise a first plate, a second plate and a third plate. The first plate may comprise the first elastic units and may be arranged floatingly between the second plate comprising the second elastic units and the third plate. The size of the multiple receptacles may be delimited by the first abutting sections of the first plate and the second abutting sections of the second plate. The first plate may be adapted to allow for a mutual floating of the multiple align fixtures. The second plate and the third plate may be fixedly mounted to each other. The first plate may be adapted to allow for a mutual floating (particularly connected or constructed so as to operate and adjust smoothly) of the multiple receptacles. The handling structures may be adapted to move the first plate towards an enlarged size of the receptacles against the total force. The plate connecting elastic unit may be adapted to move the first plate towards the clamping size of the receptacles. The first plate, the second plate and the third plate may be arranged parallel to each other. The first plate may move along the second plate and the third plate between which the first plate may be arranged. The first plate may be secured against unwanted deformation in each direction which may be the direction towards the second plate and the direction towards the third plate. The second plate and the second plate may be planar or may have recesses adapted to guide the movement of the first plate.

The second plate may be the base support plate and may comprise the base support sections which may be adapted to support main surfaces of the electronic components. The base support sections of the receptacles may be formed from the second plate. The base support plate assigned to the respective receptacle may extend to a second plate integrally formed from one plate or made up of multiple base support plates. The orientation of the second plate may be parallel to each of the receptacles and may be parallel to each of the base support sections. The support force exerted by each of the base support sections may act perpendicularly on main planes of the electronic component and may be parallel to each other.

The third plate may be a base support plate and comprises base support sections which are adapted to support main surfaces of the electronic components.

In the following, further exemplary embodiments of the method will be described. However, these embodiments also apply to the align fixture and to the carrier.

The method may further comprise placing the electronic components in a post processing machine and subsequently subjecting the electronic components to an operation of the post-processing machine while the electronic components maintain in aligned positions in the receptacles of the carrier. A method of post-processing may particularly denote a process of evaluation or test of electronic components. Hence, a post-processing machine may particularly denote a machine for evaluating or testing of electronic components. During post-processing the electronic components may be subjected under various physical conditions to get information about the quality of the electronic components. Post-processing may particularly denote a quality test or a quality evaluation of the electronic component by subjecting the electronic components under the various electrical and/or mechanical conditions of interest.

The method may further comprise elastically clamping the electronic components by the clamping mechanism exclusively on side sections of the electronic components. The electronic components may be placed in enlarged receptacles of a carrier and thereupon may be elastically clamped and aligned by a clamping mechanism in a clamping size of the receptacles. The transition of the enlarged size of the receptacles to a clamping size of the receptacles may take place in a main plane of the receptacle. The main plane of the receptacle may match with a main plane of the carrier, with a main plane of the electronic component and with a main plane of the align fixture. The carrier may be put into a post-processing machine. While the electronic components are clamped and aligned in the receptacles the electronic components may be subjected to operations of the post-processing machine.

The method may further comprise providing the carrier with an identifying feature or an identifier for definite (particularly precise, unique or unambiguous) identification of the carrier. Post-processing machines may form an assembly line. The carriers may be transported from one post-processing machine to a further post-processing machine. A unique identification of each of the carriers in a plant during post-processing enables tracking (particularly tracing) the way of each of the carriers in the plant and enables tracking each of the electronic components. Thus, by the identifying feature each of the carriers and each of the electronic components may be tracked in an assembly line.

The method may further comprise providing the carrier with fiducial markers for fiducial detection. A vision system together with fiducial markers or marks may provide a detection of the position and orientation of the carrier in a post-processing machine. This may be advantageous when operating processes which need accurate alignment of the carrier such as for marking or contacting the electronic components.

The method may comprise aligning the electronic components with the second abutting sections, wherein the first force may be exerted in a self-acting manner by elastic (particularly flexible, resilient or springy) units (particularly a piece or complex of apparatus serving to perform one particular function) to which the first abutting sections and the second abutting sections are mounted. Each one of the abutting sections may be mounted at least to an assigned one of the elastic units. The first elastic units may each exert the first forces towards the second abutting sections. The second elastic units may each exert second forces towards the first abutting sections. Each one of the second abutting sections is assigned to one of the first abutting sections. The electronic components may be aligned with the second abutting sections.

The method may further comprise exerting two force components on at least one of the first abutting sections and the second abutting sections so that this abutting sections exert two angled force components on the electronic components.

The post-processing may comprise laser marking while the electronic components are held and aligned by the carrier and are moved by handling the carrier. While the electronic components are clamped and aligned in the receptacles the electronic components may be subjected to a laser marking procedure. The electronic components may have an accessible symbol side independent of whether the contact side abuts with the base support section or whether the symbol side abuts with the base support section. If the contact sides abut with the base support sections the symbol side lies open to the receiving side and may be subjected to laser marking without any restrictions. If the symbol sides abut with the base support sections the base support sections of the receptacles may have access openings in their centres extending only so far that the edge regions of the electronic components still abut with the base support sections.

The post-processing may comprise a burn-in test while the electronic components are held and aligned by the carrier and are moved by handling the carrier. In a burn-in test the electronic components, especially semiconductor devices, may be subjected to heat for a predefined time interval (for instance temperatures of up to 200° C. for a fraction of an hour up to several hours). During the burn-in test the electronic components may be additionally subjected to a power test by a current feed and/or the electronic components may be subjected to an electronic test for testing the electronic quality of the electronic components. The carrier may be adapted to withstand high temperatures by forming the carrier of temperature resistant materials like metal, thermosetting plastics or resins.

The post-processing may comprise a bake-in process while the electronic components are held and aligned by the carrier and are moved by handling the carrier. The bake-in process may be a process where the electronic components are heated for a predefined time interval (for instance temperatures of up to 200° C. for a fraction of an hour up to several hours) without any electrical test or load. Forming the carrier from temperature resistant materials may enable the carrier to withstand bake-in processes, wherein the electronic components are subjected to high temperatures for a period of about one hour. The bake-in process may be used to reduce electrical load on the electronic components to further continue with a final test.

The post-processing may comprise a final test on a handler while the electronic components are held and aligned by the carrier and are moved by handling the carrier. The final test having a variety of embodiments may be a test being carried out before the electronic components are assembled. The final test of electronic components, e.g. semiconductor devices, may be an electronic functional test and may comprise a variety of physical test conditions, such as a variety of temperatures, pressures, accelerations and inclination angles in an arbitrary combination. Forming the carrier from a material or materials which withstand the mechanical and temperature strain the carrier may be adapted to align the electronic components under these variable conditions and may be adapted to allow for a contacting the contacts of the electronic components.

In an embodiment the post-processing does not comprise or may be free of a final test on a handler while the electronic components are held and aligned by the carrier and are moved by handling the carrier. After laser marking, burn-in or bake-in directly a selective marking may be operated on the electronic components.

The post-processing may comprise a selective marking while the electronic components are held and aligned by the carrier marking and are moved by handling the carrier. With reference to the explanation of the laser marking same is valid for selective marking, e.g. laser marking: The electronic components may have an accessible symbol side independent of whether the contact side abuts with the base support section or whether the symbol side abuts with the base support section. If the contact sides abut with the base support sections the symbol side lies open to the receiving side and may be subjected to laser marking without any restrictions. If the symbol sides abut with the base support sections the base support sections of the receptacles may have openings in their centres extending so far that the edge regions of the electronic components abut with the base support sections. After selective marking the electronic components placed in the carrier may be selectively marked "positive", selectively marked "negative" or may be completely marked either "positive" or "negative". Other classifications (different from "positive" or "negative") are possible as well. The selective marking may also comprise a mark pointing out a quality feature of the electronic components, e.g. a mark which signs the maximum frequency to operate a semiconductor device.

At least two of the group consisting of the laser marking, the burn-in test, the bake-in, the final test and the selective marking may be performed without removing the electronic components from the carrier. In other words, multiple of these or other procedures may be carried out while the electronic component remains aligned in the carrier. The carrier may be adapted to withstand a variety of physical conditions and may accurately align the electronic component through complete or partial post-processing. Thus, the electronic components may be held and aligned in the carrier during the complete post-processing or parts of post-processing.

After the post-processing the electronic components may be removed from the post-processing machine by removing the carrier from the post-processing machine while the electronic components are held and aligned by the carrier.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

The illustration in the drawing is schematically. In different drawings, similar or identical elements are provided with the same reference signs.

Figure 1:
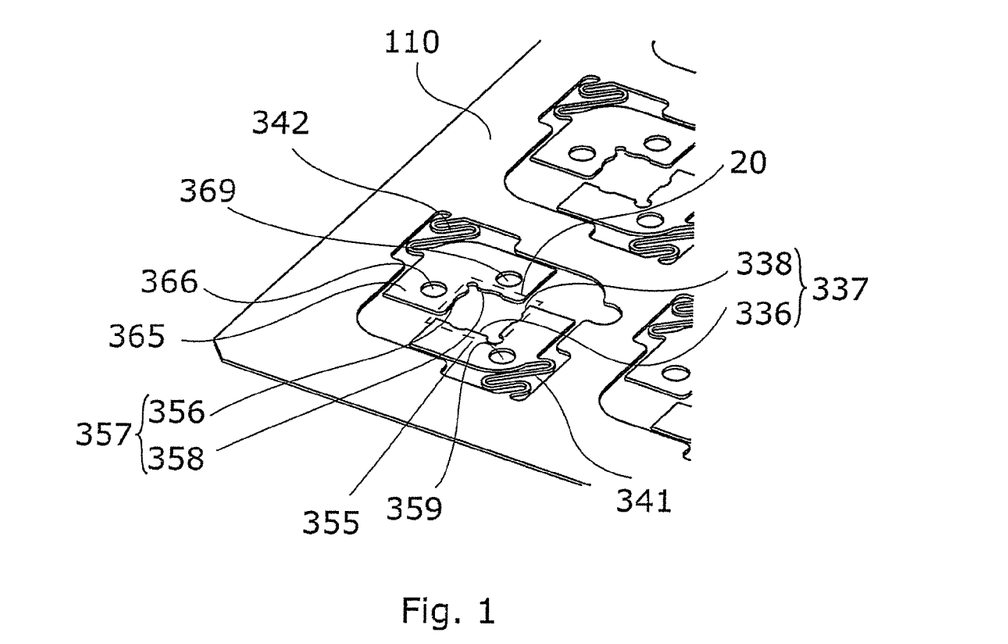
FIG. 1 shows a detailed view of a spring plate and FIG. 2 shows an overview of a carrier having such a spring plate according to an exemplary embodiment of the invention.

FIG. 1 shows a detailed view of a spring plate 110 adapted to engage an electronic component 1 (see FIG. 2) in a receptacle 20. The receptacle 20 is formed by a first abutting section 337 and a second abutting section 357 being arranged diagonally opposing one another. The first abutting section 337 comprises a first abutting element 336 (or surface) and a second abutting element 338 (or surface) which are angled to each other, in the shown embodiment enclosing an angle of about 90°. The second abutting section 357 has a similar shape as the first abutting section 337. The second abutting section 357 comprises a first abutting element 356 (or surface) and a second abutting element 358 (or surface), in the shown embodiment enclosing an angle of about 90°. The first abutting section 337 is formed from an integrally formed second abutting member 365. The second abutting member 365 comprises an actuatable structure or adjusting unit formed from a first adjusting hole 366 and a second adjusting hole 369. The second abutting member 365 is basically L-shaped and mirror-symmetrical. The first abutting element 356 and the second abutting element 358 show both two bows extending to the abutting surface so that an electronic component 1 may abut with two points of each of the first abutting element 356 and the second abutting element 358. A meandrical second spring element 342 couples the second abutting member 365 and a frame section of the spring plate 110.

A first abutting member 355 located opposing to the second abutting member 365 is of a similar shape. A main difference between the second abutting member 365 and the first abutting member 355 is that the first abutting member 355 only comprises one adjusting hole 359 on the axis of symmetry between first abutting element 336 and second abutting element 338 which form the first abutting section 337. A meandrical first spring element 341 couples the first abutting member 355 and a frame section of the spring plate 110.

A size of the receptacle 20 may be enlarged by actuating the first adjusting hole 366 and the second adjusting hole 369 of the second abutting member 365 in the direction diagonally away from the first abutting section 337. The size of the receptacle 20 may also be enlarged by actuating the adjusting hole 359 of the first abutting member 355 diagonally away from the second abutting section 357. Any suitable actuating structure, such as a pin or a hook may be used to actuate the actuatable adjusting holes 366, 369, 359. By releasing the forces of the first spring element 341 and/or the second spring element 342 the electronic component may be engaged between the first abutting section 337 and the second abutting section 357. The actuatable adjusting holes 366, 369 and 359 may be adapted for fine adjusting one of the first abutting section 337 and the second abutting section 357. Thus, the electronic component may be fine adjusted for further operations. The first adjusting hole 366 and second adjusting hole 369 of the second abutting member 365 and adjusting hole 359 of the first abutting member 359 may be used for support the clamping of the electronic components and may be used for fine adjusting the electronic component.

Figure 2:
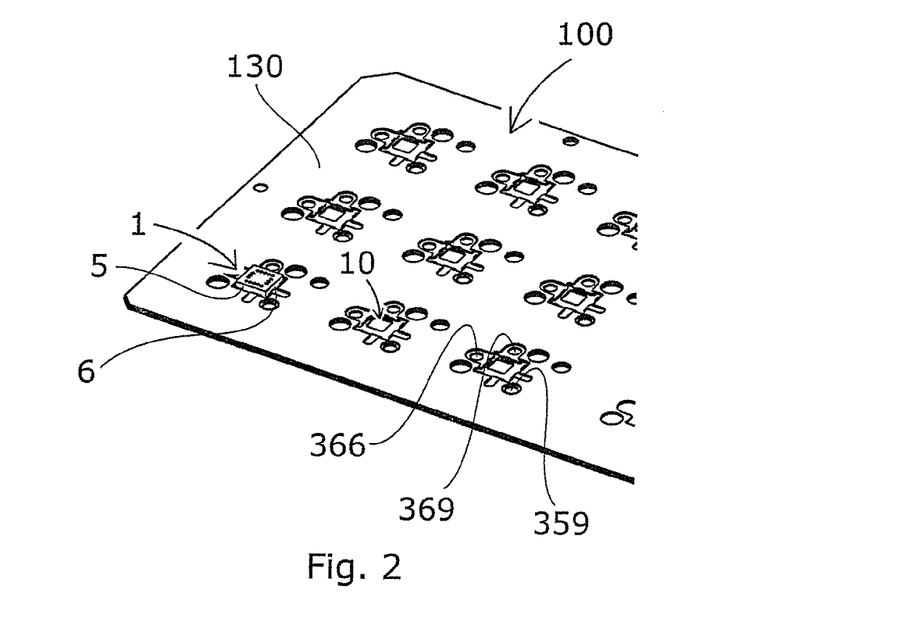

FIG. 2 shows an assembled carrier 100 according to an embodiment of the invention.

An electronic component 1 with a first side section 5 and a second side section 6 is visible and is positioned by an align fixture 10. The first adjusting hole 366 and the second adjusting hole 369 of the second abutting member 365 are accessible through a receiving plate 130. Similarly the adjusting hole 359 of the first abutting member 355 is accessible through access holes of the receiving plate 130.

Figure 3:
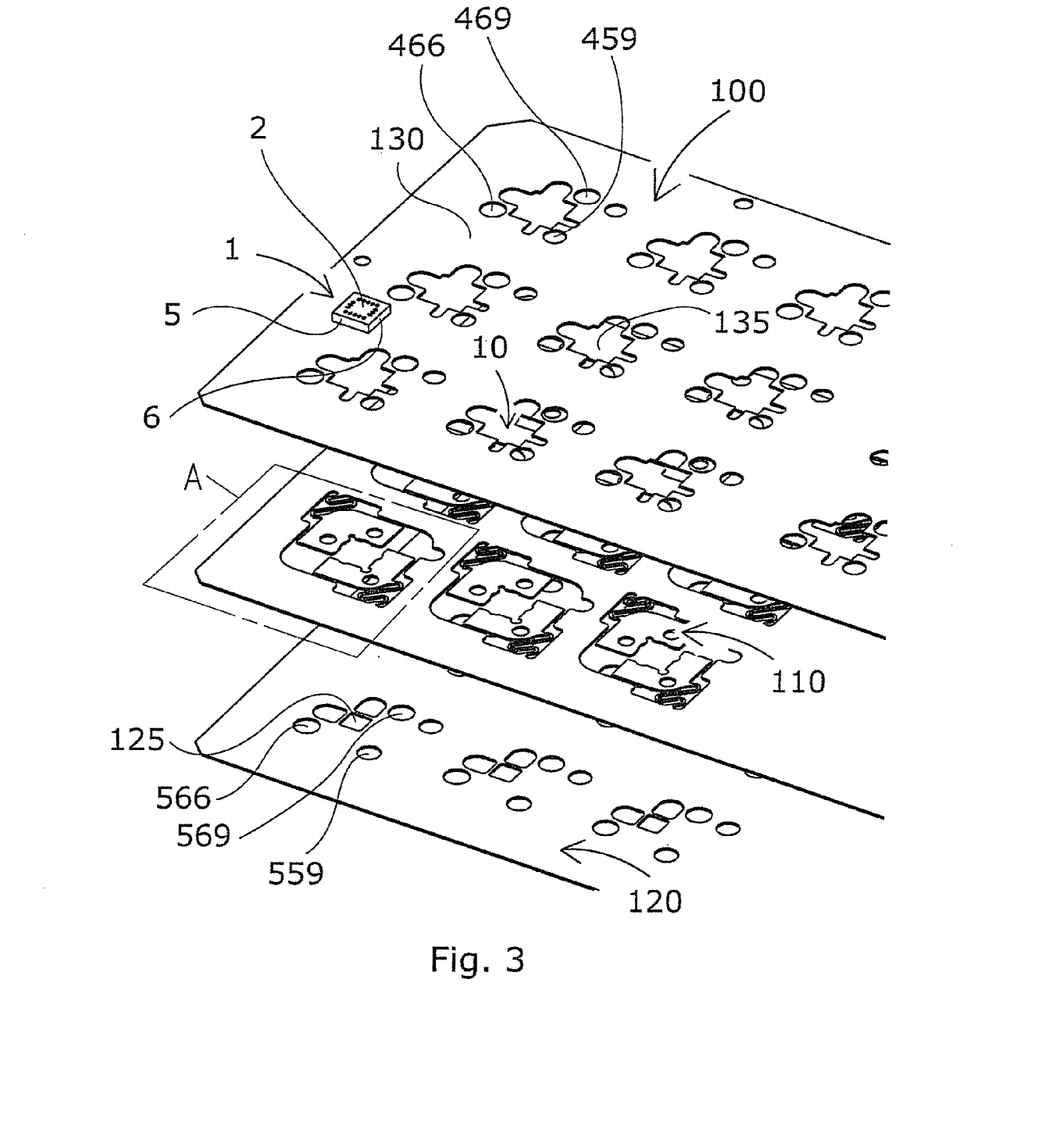
FIG. 3 shows an exploded view of the assembled carrier of FIG. 2.

FIG. 3 shows an exploded view of the carrier 100 shown assembled in FIG. 2. The carrier 100 is formed of receiving plate 130, spring plate 110 and a base support plate 120. An electronic component 1 may be received through a receiving opening 135 of the receiving plate 130. The electronic component 1 may be received in the receptacle 20 (shown in FIG. 1) of the align fixtures 10. An adjustment access hole 459 of the receiving plate 130 and an adjustment access hole 559 of the base support plate 120 lie aligned to the adjustment hole 359 of the first abutting member 355 (shown in FIG. 1) according to the respective align fixtures 10 and allow for a movement of the adjustment hole 359 since the adjustment access holes 559 have a wider diameter. Same holds for a first adjustment access hole 466 and a second adjustment access hole 469 of the receiving plate 130 and for a first adjustment access hole 566 and a second adjustment access hole 569 of the base support plate 120 each of the adjustment access holes having a wider diameter than the respective adjustment hole and lying aligned with the respective first adjustment hole 366 and the second adjustment hole 369 of the spring plate 110 shown in FIG. 1.

Figure 4:
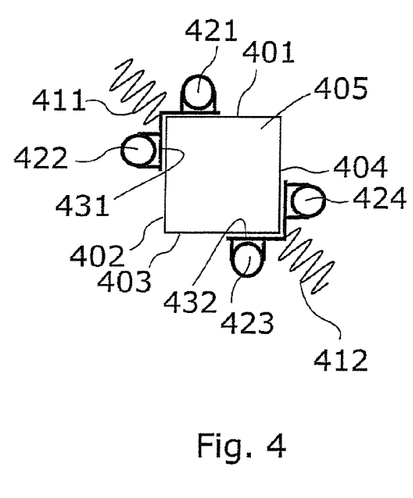
FIG. 4 to FIG. 7 schematically show different align fixtures according to exemplary embodiments of the invention.

FIG. 4 shows a schematic view of an align fixture (shown in FIG. 2) according to an embodiment similar to the embodiment depicted in FIG. 1. An angled first abutting section 431 flexibly mounted via a first elastic unit 411 engages one corner region of the electronic component 405 at a first side section 401 and at a second side section 402 of the electronic component 405. A first adjusting hole 421 and a second adjusting hole 422 may be adapted to allow for linear and angular positioning of the first abutting section 431 and thus of the electronic component 405. In a plan view the first adjusting hole 421 and the second adjusting hole 422 lie outside of a receiving area of the electronic component 405 and are thus accessible even if the first abutting section 431 abuts with the electronic component 405. On the opposite corner region the same construction can be found: An angled second abutting section 432 abuts with a third side section 403 and a fourth side section 404 of the electronic component 405. The second abutting section 432 is flexibly mounted via a second elastic unit 412. A third adjusting hole 423 and a fourth adjusting hole 424 may be adapted to allow for linear and angular positioning of the second abutting section 432 and thus of the electronic component 405. Each of the first elastic unit 411 and the second elastic unit 412 is arranged diagonally towards the respective corner region of the electronic component 405. Thus, the first abutting section 431 and the second abutting section 432 together floatingly engage the electronic component 405.

Figure 5:
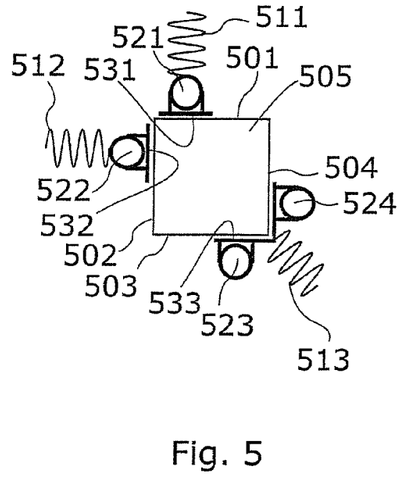

A first abutting section 531 is a straight abutting element flexibly mounted via a first elastic unit 511 and comprises a first adjusting hole 521 for adjusting the position of the first abutting section 531. The first abutting section 531 abuts with a first side section 501 of an electronic component 505. Angularly to the first abutting section 531 and at the same corner region of the electronic component 505 a second abutting section 532 abuts with a second side section 502 of the electronic component 505. A second adjusting hole 522 is fixedly coupled to the second abutting section 532. The first abutting section 531 and the second abutting section 532 may allow for a linear and angular positioning of the electronic component by adjusting the position of the first abutting section 531 via the adjusting hole 521 and by adjusting the position of the second abutting section 532 via the second abutting hole 522. The first elastic unit 511 and a second elastic unit 512 may be arranged angularly to each other so that the first elastic unit 511 is arranged perpendicularly to the first abutting section 531 and the first side section 501 of the electronic component 505. Also the second abutting unit 512 may be arranged perpendicularly to the second abutting section 532 and perpendicularly to the second side section 502 of the electronic component 505. An angled third abutting section 533 abuts with a third side section 503 and a fourth side section 504 of the electronic component 505. The third abutting section 533 is flexibly mounted via a third elastic unit 513. The third elastic unit 513 is arranged diagonally towards the respective corner region of the electronic component 505 formed by the third side section 503 and the fourth side section 504 of the electronic component 505. Thus, the first abutting section 531 and the second abutting section 532 together floatingly engage the electronic component 505. A third adjusting hole 523 and a fourth adjusting hole 524 are fixedly mounted at the third abutting section 533. The electronic component may be adjusted linearly and angularly by adjusting at least two angularly arranged adjusting holes of the first adjusting hole 521, the second adjusting hole 522, the third adjusting hole 523 and the fourth adjusting hole 524. "Angularly arranged adjusting holes" may hereby express that the respective abutting sections 531, 532, 533 of the adjusting holes 521, 522, 523, 524 abut on angled side sections 501, 502, 503, 504 of the electronic component 505.

Figure 6:
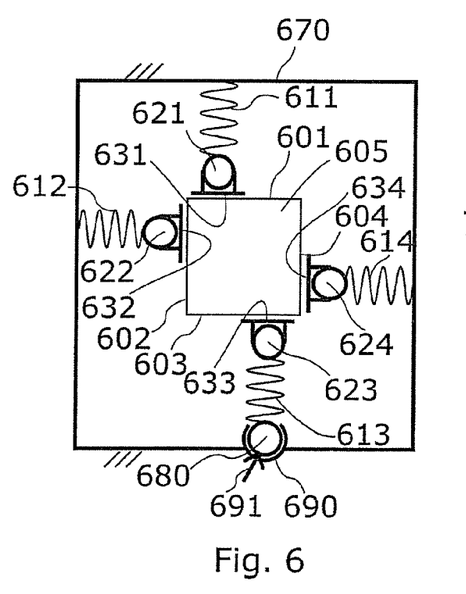

FIG. 6 shows a schematic view of an align fixture 670. A first elastic unit 611 exerts a perpendicular force on a first side section 601 of an electronic component 605 via a first abutting section 631. The position of the first abutting section 631 and of the respective first side section 601 may be adjusted by an adjusting hole 621 fixedly coupled with the first abutting section 631. Same holds for a remaining second side section 602, a third side section 603 and a fourth side section 604 of the electronic component, each being engaged and adjustable by second, third and fourth elastic units 612, 613 614, second, third and fourth abutting sections 632, 633, 634 and second, third and fourth adjusting holes 622, 623, 624 and only differing in the direction of actuation by 90°. The third elastic unit 613 may be a separate elastic member having a suspension 680 which is fixedly attached to an elastic unit receiving section 690. An interlock 691 may fix the suspension 680 at the elastic unit receiving section 690.

Figure 7:
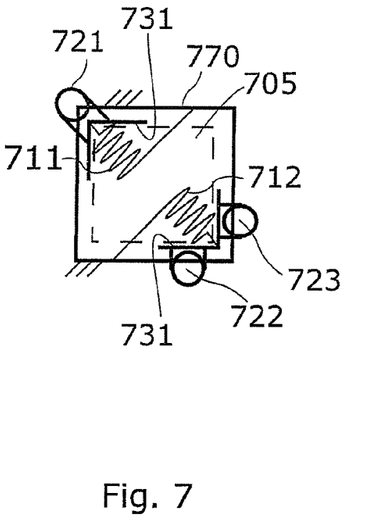

FIG. 7 shows a schematic view of an align fixture 770 similar to the embodiment according to FIG. 4, wherein the first elastic unit 711 and the second elastic unit 712 are arranged seen from a plan view in a space between an electronic component receiving area. An angled first abutting section 731 may be flexibly mounted at the first elastic unit 711 and the first abutting section 731 may comprise a first adjusting hole 721 being fixedly coupled to the first abutting section 731. An angled second abutting section 732 located at an opposite corner region of the electronic component 705 with respect to the first abutting section 731 is flexibly mounted at the second elastic unit 712. The angled second abutting section 732 comprises a second adjusting hole 722 and a third adjusting hole 723 fixedly coupled to the second abutting section 732. The electronic component 705 may be adjusted linearly and angularly at least by two of the first adjusting hole, the second adjusting hole and the third adjusting hole.

Figure 8:
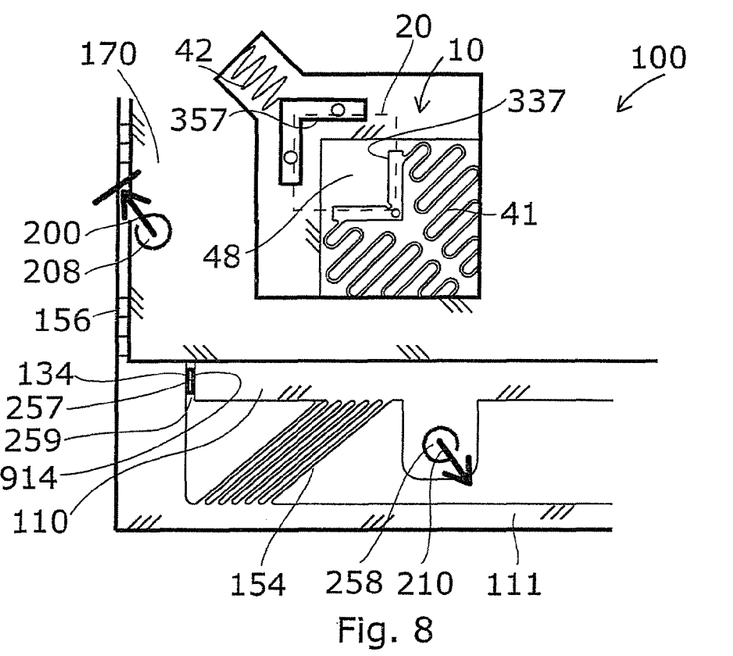
FIG. 8 shows a detailed view of a carrier of an embodiment of the invention with mutually slidable first abutting sections.
Figure 9:
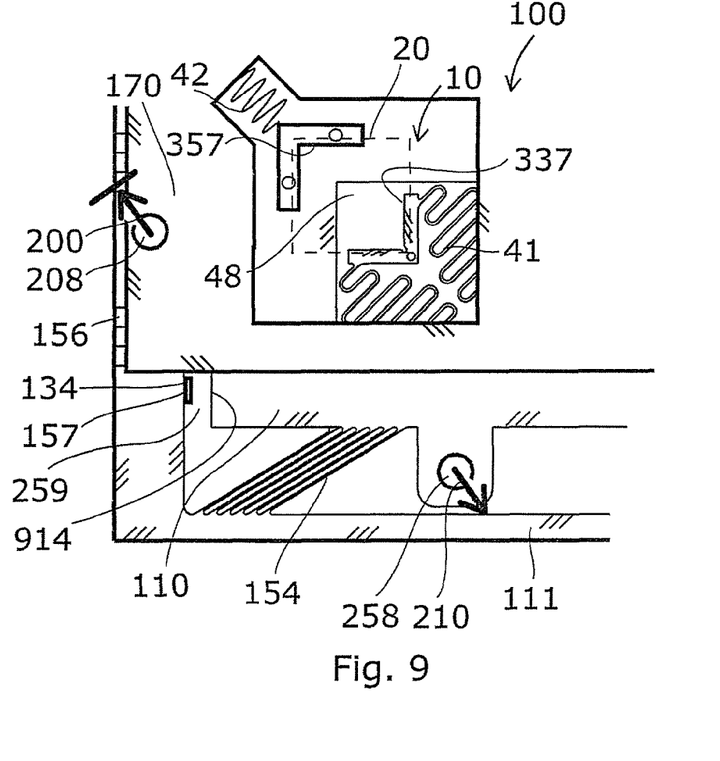
FIG. 9 shows a detailed view of the carrier according to the embodiment of FIG. 8 with mutually enlarged receptacles sizes.

FIG. 8 and FIG. 9 show a view from above of a detail of the carrier 100, wherein the carrier 100 comprises slidably mounted spring plate 110 elastically coupled to an elastic unit plate frame 111 via a plate connecting elastic unit 154. The elastic unit plate frame 111 is fixedly mounted at further spring plate 170. Thus, by bending the plate connecting elastic unit 154, the spring plate 110 may slide relative to the further spring plate 170 comprising the flexibly mounted second abutting section 357. The second abutting section 357 flexibly mounted via elastic unit 42 forms partially a boundary of the receptacle 20. The first abutting sections 337 mounted at the spring plate 110 via the first elastic units 41 also forms partially a boundary of the receptacle 20. First abutting sections 337 may slide relative to the second abutting section 357. A receptacle opening 48 of the receptacle 20 formed by the first abutting section 337 and the second abutting section 357 may be enlarged by sliding the spring plate 110 relative to the further spring plate 170. By engaging an elastic unit actuatable hole 258 with an actuation force 210 the spring plate 110 may be slid relative to the further spring plate 170 and the elastic unit plate frame 111 since the further spring plate 170 and the elastic unit plate frame 111 may be fixed at fixing hole 208. An opposing force 200 may be applied in order to fix the carrier 100 against the force of the actuation force 210. At several fixing points 156 a further spring plate 170 and the elastic unit plate frame 111 may be fixedly coupled to each other.

Referring still to FIG. 8 a first plate abutting section 134 of the further spring plate 170 and a second plate abutting section 914 of the spring plate 110 abut with each other. A spacer 257 may be adapted to regulate the size of the receptacle opening 48. When the first plate abutting section 134 and the second plate abutting section 914 abut with each other the clamping size of the receptacle formed by the first abutting section 337 and the second abutting section 357 may be reached. The size of the receptacle opening 48 may be smaller than the electronic component 1 (compare FIG. 3) to be received, so that the electronic component 1 may be clamped by the first abutting section 337 and the second abutting section 357. A space 259 between the spring plate 110 and the elastic unit plate frame 111 may have the size of the spacer 257.

Referring to FIG. 9 a receiving size of the receptacle opening 48 is shown. The space 259 between the spring plate 110 and the elastic unit plate frame 111 is enlarged. Therefore, also the size of the receptacle opening 48 may be enlarged to a size where the electronic component 1 (compare FIG. 3) may be received in the receptacle 20, i.e. in the space between the first abutting section 337 and the second abutting section 357.

It should be noted that the term "comprising" does not exclude other elements or steps and the "a" or "an" does not exclude a plurality. Also elements described in association with different embodiments may be combined. It should also be noted that reference signs in the claims shall not be construed as limiting the scope of the claims. Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. An align fixture adapted to align an electronic component, the align fixture comprising:
   a receptacle adapted to receive the electronic component and having a first abutting section and a second abutting section;
   a first elastic unit;
   a second elastic unit;
   wherein the first abutting section is flexibly mounted via the first elastic unit, and the second abutting section is flexibly mounted via the second elastic unit; and
   wherein the first abutting section and the second abutting section are together adapted to floatingly engage the electronic component such that the electronic component comes into contact with the first abutting section and with the second abutting section and is held by the first abutting section and the second abutting section while allowing for a slight self-adaptation of a position of the electronic component.

2. The align fixture according to claim 1, wherein the first abutting section is adapted to exert a first force and the second abutting section is adapted to exert a second force on the electronic component, and wherein the first force and the second force are at least partially opposed to one another.

3. The align fixture according to claim 1, wherein the first abutting section and the second abutting section are adapted so that a first force is exerted parallel to a main plane of the receptacle and a second force is exerted parallel to the main plane of the receptacle.

4. The align fixture according to claim 1, wherein the receptacle further comprises a base support section which forms a support surface parallel to a main plane of the receptacle.

5. The align fixture according to claim 1, wherein a base support section is adapted to exert a support force perpendicularly to a first force and perpendicularly to a second force.

6. The align fixture according to claim 1, wherein the flexibly mounted first abutting section and second abutting section are adapted to perform a movement parallel to a main plane of the receptacle.

7. The align fixture according to claim 1, further comprising:
   a base support plate arranged below the first elastic unit and below the second elastic unit, wherein the first elastic unit and the second elastic unit are adapted to perform a movement parallel to a main plane of the receptacle at least partially supported by the base support plate.

8. The align fixture according to claim 1, further comprising:
   a base support plate and a receiving plate between which the first elastic unit and the second elastic unit are arranged, and wherein the first elastic unit and the second elastic unit are adapted to perform a movement parallel to a main plane of the receptacle at least partially guided by the base support plate and the receiving plate.

9. The align fixture according to claim 1 further comprising:
   at least one thickness adjusting plate adapted for adjusting a thickness of the align fixture.

10. The align fixture according to claim 1, wherein at least one of the first elastic unit and the second elastic unit comprises a spring element.

11. The align fixture according to claim 1, wherein at least one of the first elastic unit and the second elastic unit comprises a first spring element and a second spring element, and wherein the corresponding one of the flexibly mounted first abutting section and the flexibly mounted second abutting section is connected with the first spring element and with the second spring element.

12. The align fixture according to claim 1, further comprising at least one elastic unit receiving section which is adapted to fix at least one of the first elastic unit and the second elastic unit being a separate elastic member at a suspension of the corresponding elastic unit so that this elastic unit is fixed to prevent rotation.

13. The align fixture according to claim 1, further comprising at least one elastic unit receiving section and at least one of the first elastic unit and the second elastic unit is fixedly mounted at the at least one elastic unit receiving section in a form locking manner.

14. A carrier for aligning multiple electronic components comprising:
   multiple align fixtures, each align fixture comprising:
      a receptacle adapted to receive the electronic component and having a first abutting section and a second abutting section;
      a first elastic unit;
      a second elastic unit;
      wherein the first abutting section is flexibly mounted via the first elastic unit, and the second abutting section is flexibly mounted via the second elastic unit; and
      wherein the first abutting section and the second abutting section are together adapted to floatingly engage the electronic component such that the electronic component comes into contact with the first abutting section and with the second abutting section and is held by the first abutting section and the second abutting section while allowing for a slight self-adaptation of a position of the electronic component.

* * * * *